(12) United States Patent
Onoda et al.

(10) Patent No.: US 11,751,287 B2
(45) Date of Patent: Sep. 5, 2023

(54) SUBSTRATE HEATING DEVICE

(71) Applicants: NISSIN ION EQUIPMENT CO., LTD., Koka (JP); HIMEJI RIKA CO., LTD., Hyogo Prefecture (JP)

(72) Inventors: Masatoshi Onoda, Shiga (JP); Ryosuke Goto, Shiga (JP); Kazuo Shimizu, Hyogo (JP); Yasuhiro Kishimoto, Hyogo (JP)

(73) Assignees: NISSIN ION EQUIPMENT CO., LTD., Koka (JP); HIMEJI RIKA CO., LTD., Himeji (JP)

( * ) Notice: Subject to any disclaimer, the term of this patent is extended or adjusted under 35 U.S.C. 154(b) by 254 days.

(21) Appl. No.: 16/892,552

(22) Filed: Jun. 4, 2020

(65) Prior Publication Data

US 2020/0413493 A1 Dec. 31, 2020

(30) Foreign Application Priority Data

Jun. 28, 2019 (JP) .................. 2019-121169

(51) Int. Cl.
*H05B 1/02* (2006.01)
*H01L 21/67* (2006.01)

(52) U.S. Cl.
CPC ..... *H05B 1/0233* (2013.01); *H01L 21/67109* (2013.01); *H01L 21/67115* (2013.01)

(58) Field of Classification Search
CPC ......... H01L 21/67109; H01L 21/67115; H01L 21/67213; H05B 3/0033; H05B 3/0047; H05B 1/0233

USPC ....................... 219/209, 444.1; 392/407–424
See application file for complete search history.

(56) References Cited

U.S. PATENT DOCUMENTS

| | | | |
|---|---|---|---|
| 5,079,475 A * | 1/1992 | Oortman Gerlings | ... H01K 1/24 313/313 |
| 6,707,011 B2 * | 3/2004 | Tay | ...... H05B 3/0047 219/390 |
| 6,744,187 B1 * | 6/2004 | Wimberly | ................ H01K 1/26 313/111 |
| 2005/0094989 A1 * | 5/2005 | Halpin | ...... H01K 1/24 392/407 |
| 2010/0074604 A1 | 3/2010 | Koelmel et al. | |
| 2014/0017848 A1 * | 1/2014 | Ragay | ................. H01L 31/1876 392/416 |

FOREIGN PATENT DOCUMENTS

EP 1071310 * 1/2001
JP 04-218670 * 8/1992

* cited by examiner

*Primary Examiner* — Sang Y Paik
(74) *Attorney, Agent, or Firm* — Sughrue Mion, PLLC (57) ABSTRACT

A substrate heating device is provided. The substrate heating device includes a vacuum chamber and a heater. The vacuum chamber receives a substrate. The heater includes a body, a heating wire, and a terminal part. The body penetrates through a wall of the vacuum chamber such that a portion of the body is in a vacuum atmosphere of the vacuum chamber. The heating wire is provided inside the body and partly disposed inside the vacuum chamber. The terminal part is connected to the heating wire and is disposed outside the vacuum chamber.

16 Claims, 6 Drawing Sheets

SUBSTRATE HEATING DEVICE

CROSS-REFERENCE TO RELATED APPLICATION

This application claims priority from Japanese Patent Application No. JP2019-121169, filed Jun. 28, 2019 in the Japanese Patent Office, the disclosure of which is incorporated by reference herein in its entirety.

BACKGROUND

1. Field

The present disclosure relates to a substrate heating device.

2. Description of Related Art

Various methods of heating a substrate in a vacuum chamber have been suggested, such as heating the substrate through a window in the chamber or inserting a heater inside the chamber.

However, if a heater is inserted inside the vacuum chamber, there are disadvantages such as a risk of electrical discharge due to leakage of gas or the like, and/or a risk that an end of the heater may break.

SUMMARY

It is an aspect to allow a heater to be inserted inside a vacuum chamber while suppressing a situation where a terminal part thereof is heated by irradiation with light from a heating wire.

According to an aspect of one or more embodiments, there is provided a substrate heating device comprising a vacuum chamber that receives a substrate; and a heater comprising a body that penetrates through a wall of the vacuum chamber such that a portion of the body is in a vacuum atmosphere of the vacuum chamber; a heating wire provided inside the body and partly disposed inside the vacuum chamber; and a terminal part to which the heating wire is connected, the terminal part being disposed outside the vacuum chamber.

According to an aspect of one or more embodiments, there is provided a substrate heating device comprising a vacuum chamber that receives a substrate; and a heater comprising a body that penetrates a wall of the vacuum chamber, a first portion of the body being disposed in the vacuum chamber; a heating wire provided inside the body; and a terminal part to which the heating wire is connected, the terminal part being disposed outside the vacuum chamber.

According to an aspect of one or more embodiments, there is provided a substrate heating device comprising a vacuum chamber that receives a substrate; and a heating device including a plurality of heaters, each comprising a body that penetrates a wall of the vacuum chamber, a first portion of the body being disposed in the vacuum chamber; a heating wire provided inside the body; and a terminal part to which the heating wire is connected, the terminal part being disposed outside the vacuum chamber.

BRIEF DESCRIPTION OF THE DRAWINGS

The above and/or other aspects will become apparent and more readily appreciated from the following description of example embodiments, taken in conjunction with the accompanying drawings of which.

DETAILED DESCRIPTION

As one method to heat a substrate, JP 2016-178322A proposes using a heater provided outside a vacuum chamber, and configured to heat a substrate through a window formed in the vacuum chamber.

Other methods that may achieve greater heating efficiency insert a rod-shaped heater, such as a halogen lamp heater, inside the vacuum chamber.

However, if the entire heater is inserted inside the vacuum chamber, there is concern that a terminal part of the heater is heated to high temperatures by irradiation with light from a heating wire included in the heater and, due to resulting thermal expansion of, for example, a molybdenum foil, a molybdenum rod and others part of the terminal part, stress may be applied to a quartz tube covering the terminal part, from inside, leading to breakage of the terminal part. Moreover, if, due to the above thermal expansion, a gap is formed between the terminal part and the quartz tube, there is a concern that gas such as halogen gas may leak from the gap, leading to an electrical discharge around the terminal part.

As above, even if the heater is inserted inside the vacuum chamber so as to improve heating efficiency, there arise disadvantages in that a risk of electrical discharge due to leakage of the halogen gas or the like and a risk of breaking the terminal part may occur.

According to various embodiments disclosed herein, a substrate heating device includes a vacuum chamber for receiving therein the substrate, and a heater inserted inside the vacuum chamber. The heater includes a tube-shaped body provided in a vacuum atmosphere while penetrating through a wall of the vacuum chamber; a heating wire received inside the tube-shaped body and partly disposed inside the vacuum chamber; and a terminal part to which the heating wire is connected, wherein the terminal part is disposed outside the vacuum chamber.

In the substrate heating device, the terminal part is disposed outside the vacuum chamber, so that light directed toward the terminal part from the heating wire may be blocked by the wall of the vacuum chamber, and thereby it is possible to insert the heater inside the vacuum chamber, while suppressing a situation where the terminal part is heated by irradiation with light from the heating wire.

As compared with a related art case in which the entire heater is disposed outside the vacuum chamber, the configuration according to various embodiments makes it possible to improve heating efficiency, while eliminating the risk of electrical discharge due to gas leakage which is likely to occur when the entire heater is disposed inside the vacuum chamber. Further, in the related art case, when the terminal part is disposed inside the vacuum chamber, electrical discharge is likely to occur in the vicinity of the terminal part, even when no gas leakage occurs. By contrast, in the substrate heating device according to various embodiments, the terminal part is disposed outside the vacuum chamber, so that there is no concern about such electrical discharge.

Further, in the related art case, when the terminal part is disposed inside the vacuum chamber, a lead wire and the like connected to the terminal part are also disposed inside the vacuum chamber, so that impurities originated from the lead wire and the like are likely to arise inside the vacuum chamber. By contrast, in the substrate heating device according to various embodiments, the terminal part is disposed outside the vacuum chamber, and thereby a lead wire and the like connected to the terminal part are also disposed outside the vacuum chamber, so that it is possible to prevent a situation where impurities originated from the lead wire and the like arise inside the vacuum chamber.

Furthermore, in the related art case, when the terminal part is disposed inside the vacuum chamber, and the vacuum chamber is opened to the atmosphere, there is a concern that the terminal part may become more likely to be oxidized when heated to high temperatures and, due to expansion caused by the oxidation, a sealed portion of the terminal part may be broken. By contrast, the substrate heating device according to various embodiments may suppress the situation where the terminal part is heated by irradiation with light from the heating wire, so that it is possible to suppress the oxidation of the terminal part and reduce the risk of breakage of the sealed portion.

In the substrate heating device according to various embodiments, the tube-shaped body may be disposed to penetrate through a through-hole formed in the wall, and may be provided with a ring-shaped sealing member around an outer peripheral surface thereof, wherein the heating wire is configured such that an amount of heat generation by the portion penetrating through the through-hole is less than that of the portion disposed inside the vacuum chamber.

According to this feature, the through-hole is hermetically sealed by the ring-shaped sealing member provided around the outer peripheral surface of the tube-shaped body. Further, the amount of heat generation of the portion of the heating wire penetrating through the through-hole is set to be relatively low, so that it is possible to reduce a thermal influence on the ring-shaped sealing member.

In some embodiments, the heating wire may be configured such that an electrical resistance of the portion penetrating through the through-hole is less than that of the portion disposed inside the vacuum chamber.

The substrate heating device according to various embodiments may further comprise a light leakage suppressing member provided inside the tube-shaped body to block light rays which would otherwise leak toward the terminal part, among light rays emitted from the heating wire.

According to this feature, it is possible to block much more light directed toward the terminal part from the heating wire, thereby more effectively suppressing the situation where the terminal part is heated by irradiation with light from the heating wire.

In some embodiments, a position of the light leakage suppressing member inside the tube-shaped body may lie in a range from a height position of an inner wall surface of the wall to a height position at which the ring-shaped sealing member is provided.

According to this feature, it is possible to reduce light directed toward the ring-shaped sealing member from the heating wire, as well as the light directed toward the terminal part from the heating wire. This makes it possible to additionally prevent degradation of the ring-shaped sealing member.

In the substrate heating device according to various embodiments, the tube-shaped body may be provided with a protrusion protruding inwardly from an inner peripheral surface of a portion thereof penetrating through the wall, wherein the substrate heating device may further comprise a support member provided inside the tube-shaped body and attached to the heating wire while being supported by the protrusion.

According to this feature, it is possible to suppress a situation where the heating wire droops by its own weight.

In the substrate heating device according to various embodiments, the tube-shaped body may have a first end portion and a second end portion each penetrating through the wall; and an elongated portion bent from the first end portion and the second end portion and disposed inside the vacuum chamber.

According to this feature, the terminal part can be disposed outside the vacuum chamber, in a state in which it is received in each of the first and second end portions of the tube-shaped body.

According to various embodiments, the substrate heating device may allow the heater to be inserted inside the vacuum chamber while suppressing the situation where the terminal part is heated by irradiation with light from the heating wire.

With reference to the drawings, a heating device and an ion beam irradiation apparatus incorporating the heating device according to various embodiments will now be described.

<<Apparatus Configuration>>

Figure 1:
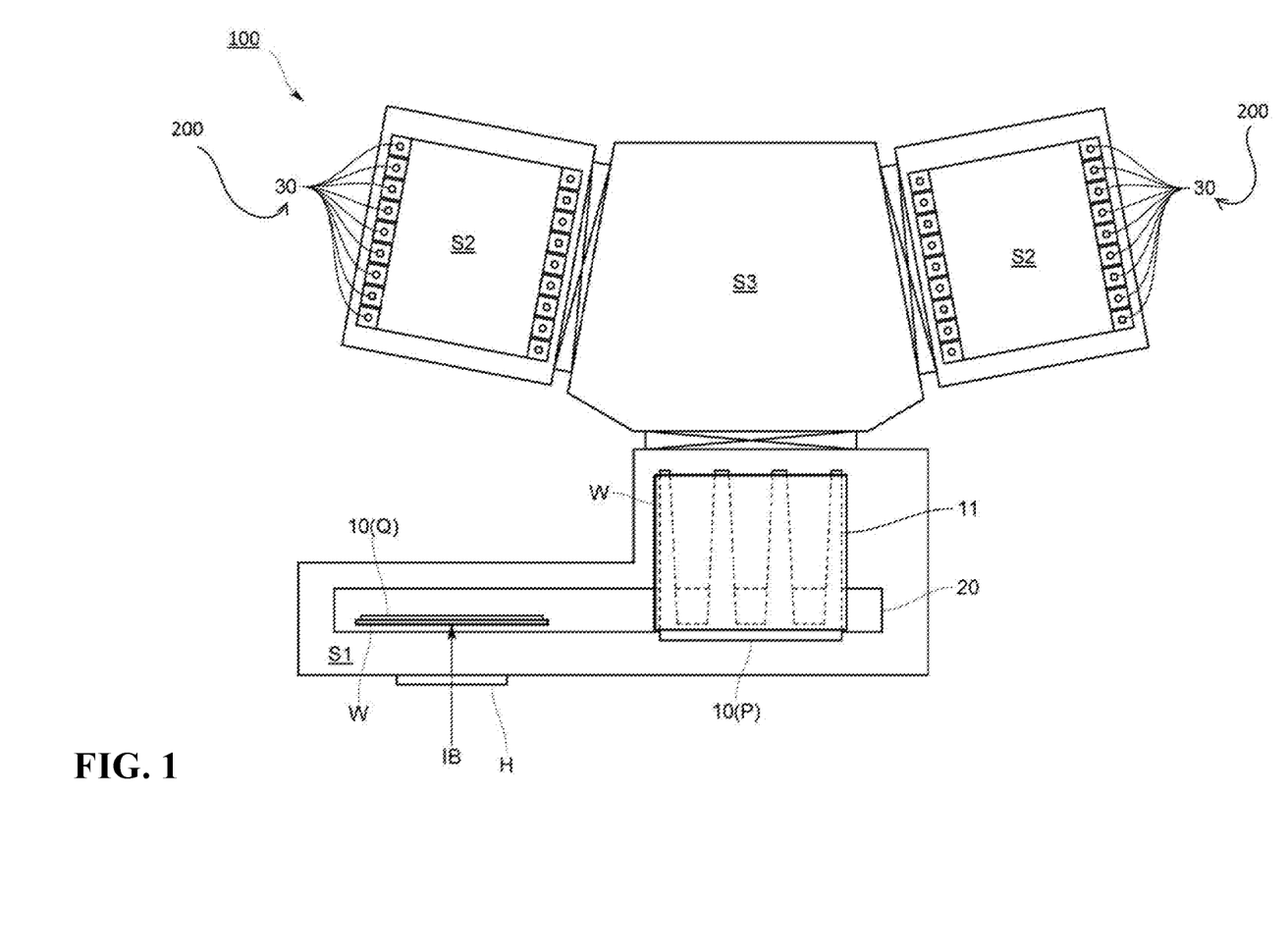
FIG. 1 is a schematic diagram showing an example of a configuration of an ion beam irradiation apparatus according to an embodiment.

FIG. 1 is a schematic diagram showing an example of a configuration of an ion beam irradiation apparatus according to an embodiment.

For example, an ion beam irradiation apparatus 100 is configured to irradiate a substrate W for use in, e.g., a flat-panel display, with an ion beam IB, to implant ions into the substrate W. The substrate W here is an approximately rectangular-shaped thin plate, such as a glass substrate, a single-crystal silicon substrate, a polysilicon substrate or a semiconductor substrate to be irradiated with an ion beam IB. It should be understood that the shape of the substrate W is not particularly limited, and thus is not limited to a rectangular shape, but may have any of various shapes such as a circular shape, etc.

Specifically, as shown in FIG. 1, the ion implantation apparatus 100 may include a processing chamber S1, a vacuum chamber S2, and a transfer chamber S3. In the processing chamber S1, the substrate W is processed by being irradiated with an ion beam IB in a vacuum atmosphere. The vacuum chamber S2 is configured to be switched between an atmospheric pressure atmosphere and a vacuum atmosphere, and in a situation where the processing changer S1 is maintained in a vacuum atmosphere, to allow the substrate W to be carried into the processing chamber S1 and out of the processing chamber S1 and to be received therein. In some embodiments, the vacuum chamber S2 may be preferred to as a "lock chamber." The transfer chamber S3 is provided between the processing chamber S1 and the vacuum chamber S2 in adjacent relation thereto and configured to allow the substrate W to be transferred between the processing chamber S1 and the vacuum chamber S2 in a vacuum atmosphere. As above, each of the chambers S1 to S3 may be capable of being maintained in a vacuum atmosphere. As such, a vacuum valve such as a gate valve is provided in a connection area between each adjacent two of the chambers S1 to S3, and configured to allow the chambers S1 to S3 to be maintained in a vacuum atmosphere, individually.

The processing chamber S1 is provided with a beam inlet H for introducing therethrough an ion beam IB passing through a mass analysis system (not shown) comprising an analysis electromagnet and an analysis slit, after being extracted from an ion source (not shown) by an extraction electrode.

As shown in FIG. 1, the processing chamber S1 is provided with a holder 10 that holds the substrate W, and a holder moving mechanism 20 that moves the holder 10.

The holder 10 is a member called a "platen", and, in the example of FIG. 1, is formed in a comb shape in which plural (e.g., four) comb teeth 11 are arranged side-by-side at given intervals. In FIG. 1, the same holder 10 is illustrated in two different postures (a lying-down posture P and upstanding posture Q, to be described later), for the purpose of illustration. While only one holder 10 is illustrated in the processing chamber S1, embodiments are not limited thereto and, in some embodiments, the holder 10 may be provided as a plurality of holders.

The holder moving mechanism 20 is configured to turn the holder 10 between the lying-down posture P in which the holder 10 lies down to allow the substrate W to be placed thereon, and an upstanding posture Q in which the holder 10 is stood upright from the lying-down posture P, and move the holder 10 in the upstanding posture Q, in a scanning manner in a given direction. Thus, the substrate W held by the hold 10 is moved in a scanning manner to come across the ion beam IB, so as to be irradiated with the ion beam IB. The holder moving mechanism 20 may comprise, for example, a motor and one or more gears, belts, etc. under control of a hardware circuit or microprocessor to move the substrate W.

The ion beam irradiation apparatus 100 according to the embodiment illustrated in FIG. 1 further comprises a heating device 200 that heats the substrate W to be irradiated with the ion beam IB.

Figure 2:
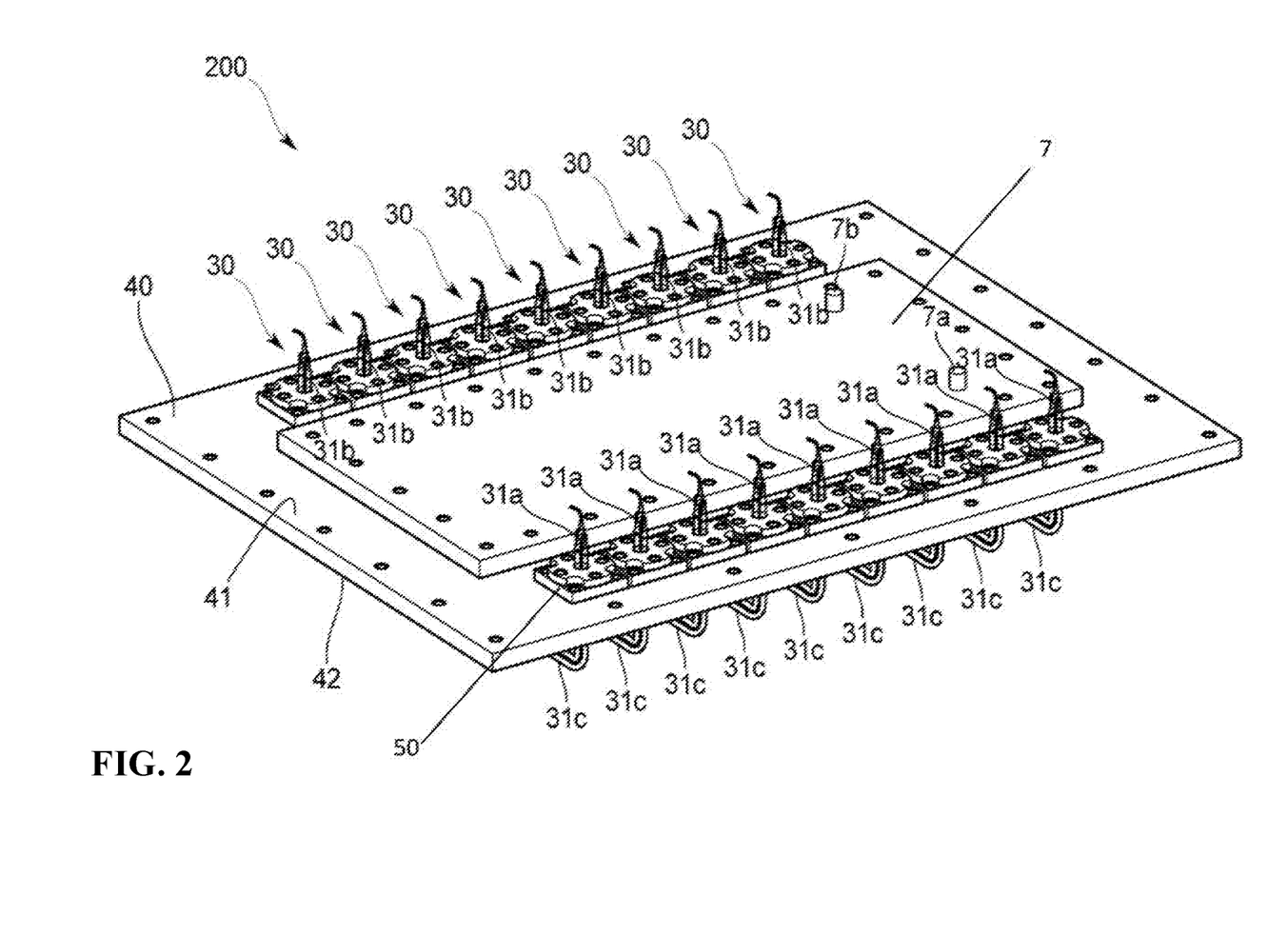
FIG. 2 is a schematic diagram showing an example of an arrangement of a heating device in the ion beam irradiation apparatus of FIG. 1, according to an embodiment.
Figure 3:
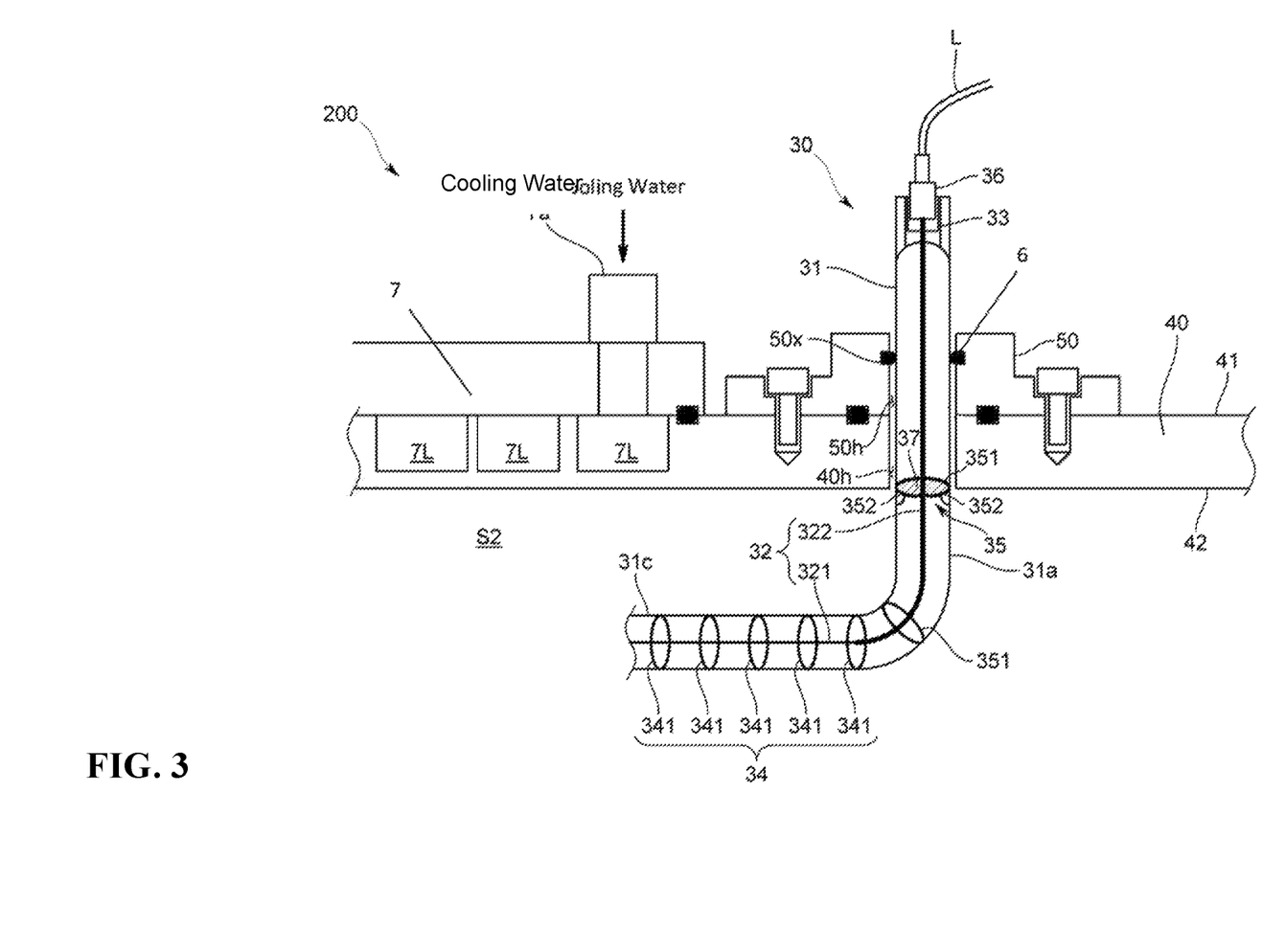
FIG. 3 is a sectional view showing a detailed configuration of one end of a single heater of the heating device of FIG. 2, according to an embodiment.

FIG. 2 is a schematic diagram showing an example of an arrangement of a heating device in the ion beam irradiation apparatus of FIG. 1, according to an embodiment. FIG. 3 is a sectional view showing a detailed configuration of one end of a single heater of the heating device of FIG. 2, according to an embodiment. It is noted that FIG. 3 illustrates only one end portion of the single heater. It will be appreciated that the other end portion of the single heater has a similar configuration and thus a detailed description thereof is omitted for conciseness.

The heating device 200 may include the vacuum chamber, and a heater 30 inserted into the vacuum chamber S2, as illustrated in FIG. 1. As described above, in some embodiments, the vacuum chamber S2 may be a lock chamber. However, this is only an example and, in other embodiments, the heater 30 may be provided in another vacuum chamber in which heating is performed. As shown in FIG. 2, according to some embodiments, each of a plurality of heaters 30 may be provided inside the vacuum chamber S2 in a state in which each heater 30 penetrates through an upper wall 40 of the vacuum chamber S2.

More specifically, as shown in FIGS. 2 and 3, each of the heaters 30 has a U shape (e.g., including 31a, 31b, 31c illustrated in FIG. 2 to be described in more detail below) in which each of one end portion (e.g., 31a) and the other end portion (e.g., 31b) thereof penetrate through the upper wall 40, and a bent portion (e.g., 31c) is formed inside the vacuum chamber S2. The U-shaped heaters 30 are arranged parallel to each other.

As shown in FIG. 3, each of the heaters 30 may include a body 31, a heating wire 32, and a terminal part 33. The body 31 may be tube-shaped and may be provided to penetrate through the upper wall 40 of the vacuum chamber S2. The heating wire 32 is received inside the body 31 and is partly disposed inside the vacuum chamber S2. The terminal part 33 is connected to the heating wire 32. Specifically, each of the heaters 30 may be a halogen lamp heater. Each of the components will be described below.

[Body 31]

The body 31 may comprise a glass tube in which one end opening and the other end opening thereof are sealed, and halogen gas is encapsulated thereinside. Hereinafter, the body 31 will be described as a tube-shaped body 31. However, embodiments are not limited to this, and in some embodiments, the body 31 may have other shapes. As shown in FIGS. 2 and 3, the tube-shaped body 31 is provided inside a vacuum atmosphere of the vacuum chamber S2 while penetrating through a circular-shaped through-hole 40h formed in the upper wall 40. More specifically, the tube-shaped body 31 is formed in a U shape and includes a first end portion 31a and a second end portion 31b each penetrating through the upper wall 40 of the vacuum chamber S2, and an elongated portion 31c that connects the first end portion 31a and the second end portion 31b and that is bent from the first end portion 31a and the second end portion 31b and located inside the vacuum chamber S2. As discussed above, it is noted that only the first end portion 31a is shown in FIG. 3, but the second end portion 31b has a similar configuration as the first end portion 31a and thus repeated description thereof is omitted for conciseness. Here, the first end portion 31a, the second end portion 31b and the elongated portion 31c are integrated into one piece, such that the elongated portion 31c is formed in a straight tube shape and disposed parallel to a surface of the substrate W that is to be heated, the substrate W being received in the vacuum chamber S2. However, this is only an example and, in some embodiments, the heater 30 may be provided as a plurality of pieces connected together.

The tube-shaped body 31 may be provided with a sealing member 6 on an outer peripheral surface thereof to hermetically seal the through-hole 40h so as to guarantee that the vacuum chamber S2 remains gas-tight. In the case of a body 31 that is tube-shaped, the sealing member 6 may be ring-shaped and by in the form of an O-ring. However, embodiments are not limited to this and, in some embodiments, the sealing member 6 may have other shapes based on the shape of the body 31.

More specifically, a mounting member 50 having a communication hole 50h in communication with the through-hole 40h is attached to an outer wall surface 41 (e.g., an upper surface) of the upper wall 40 by, e.g., a screw or other means of connection, and the ring-shaped sealing member 6 is fitted into an annular-shaped recess 50x formed on an inner surface of the communication hole 50h of the mounting member 50. Thus, the ring-shaped sealing member 6 is interposed between the annular-shaped recess 50x and the outer peripheral surface of the tube-shaped body 31, thereby hermetically sealing the through-hole 40h.

[Heating Wire 32]

As shown in FIG. 3, the heating wire 32 is a heating element obtained by winding a conductor wire such as a tungsten wire to form a coiled wire, and is provided along a tube axis of the tube-shaped body 31.

The heating wire 32 here is formed in a U shape as with the tube-shaped body 31, and includes a heat generation portion 321 that is disposed inside the vacuum chamber S2, and a penetration portion 322 that penetrates through the through-hole 40h of the upper wall 40. The heating wire 32 is configured such that an amount of heat generated by the penetration portion 322 is less than that generated by the heat generation portion 321.

The heat generation portion 321 is a portion of the heating wire 32 provided inside the elongated portion 31c of the tube-shaped body 31, to extend parallel to the substrate W received in the vacuum chamber S2. On the other hand, the penetration portion 322 is a portion of the heating wire 32 provided inside each of the first end portion 31a and the second end portion 31b of the tube-shaped body 31, to extend from the tube-shaped body 31 toward a corresponding one of the terminal parts 33. Here, the heating wire 32 is configured such that an electrical resistance of the penetration portion 322 is less than that of the heat generation portion 321, and, more specifically, a wire diameter of the penetration portion 322 is greater than that of the heat generation portion 321.

As shown in FIG. 3, in the heating wire 32 configured as above, bending of the heat generation portion 321 is suppressed by a bending suppressing mechanism 34, and drooping of the penetration portion 322 is suppressed by a drooping suppressing mechanism 35.

The bending suppressing mechanism 34 is configured such that a plurality of support rings 341 each serving as a support member provided circumferentially along an inner peripheral surface of the tube-shaped body 31 are arranged at respective positions inside the elongated portion 31c. Each of the support rings 341 is attached to the heat generation portion 321 of the heating wire 32 to hold the heat generation portion 321 in a state in which the heat generation portion 321 extends along the tube axis of the elongated portion 31c.

The drooping suppressing mechanism 35 is configured such that one or more support rings 351 each serving as a support member provided circumferentially along the inner peripheral surface of the tube-shaped body 31 are arranged at respective one or more positions inside each of the first end portion 31a and the second end portion 31b of the tube-shaped body 31. Each of the one or more support rings 351 is attached to the penetration portion 322 of the heating wire 32 to suppress a situation where the penetration portion 322 droops under its own weight. The drooping suppressing mechanism 35 here comprises protrusions 352 (best seen in FIG. 4) that protrude inwardly from the inner peripheral surface of each of the first end portion 31a and the second end portion 31b of the tube-shaped body 31, and the support ring 35 is supported by the protrusion 352.

[Terminal Part 33]

The terminal part 33 is a power supply terminal to which the heating wire 32 is electrically connected and to which an external lead wire L is electrically connected, and is configured to transfer electric power supplied via the external lead wire L to the heating wire 32. In a case where a DC voltage of, e.g., 100V or 200V, is supplied to the terminal part 33, there is a disadvantage in that there is a possibility that, upon occurrence of a disconnection, current is not immediately stopped, and an arc discharge arises at a disconnection site, leading to expansion or rupture of the tube-shaped body 31. For this reason, it is advantageous that an AC voltage is supplied to the terminal part 33. However, the present disclosure is not intended to exclude supplying a DC voltage to the terminal part 33. That is, embodiments are not limited to an AC voltage, and in some embodiments, a DC voltage may be supplied.

Specifically, the terminal part 33 may include a foil made of molybdenum, and received and sealed in the first end portion 31a of the tube-shaped body 31. Further, a connection area of the terminal part 33 with the external lead wire L may be sandwiched by insulators.

The terminal part 33 is disposed outside the vacuum chamber S2, as shown in FIG. 3. The "outside of the vacuum chamber S2" here denotes a position outward of an inner wall surface 42 of the upper wall 40 of the vacuum chamber S2. In the embodiment illustrated in FIG. 3, the terminal part 33 is disposed outward of an outer wall surface 41 of the upper wall 40.

More specifically, in a situation where the vacuum chamber S2 is maintained in a vacuum atmosphere, the terminal part 33 is disposed in an atmospheric pressure atmosphere which is a space isolated from the vacuum atmosphere. The terminal part 33 is provided at a position where light emitted from the heat generation portion 321 does not directly reach the terminal part 33, so that it becomes possible to suppress a situation where the terminal part 33 is heated by irradiation with this light. It should be noted that, if the terminal part 33 made of molybdenum is heated to, e.g., 350° C. or more, oxidation is promoted, and, due to a difference in thermal expansion coefficient from the tube-shaped body 31, a sealed portion of the tube-shaped body 31 may be broken.

Here, even when the terminal part 33 is disposed at the position where light emitted from the heat generation portion 321 does not directly reach the terminal part 33, as mentioned above, a part of the light rays are likely to travel inside the tube-shaped body 31 while undergoing refraction, reflecting or the like, so as to reach the terminal part 33, and, in a case where the penetration portion 322 emits light, this light will also reach the terminal part 33.

[Light Leakage Suppression Member 37]

Figure 4:
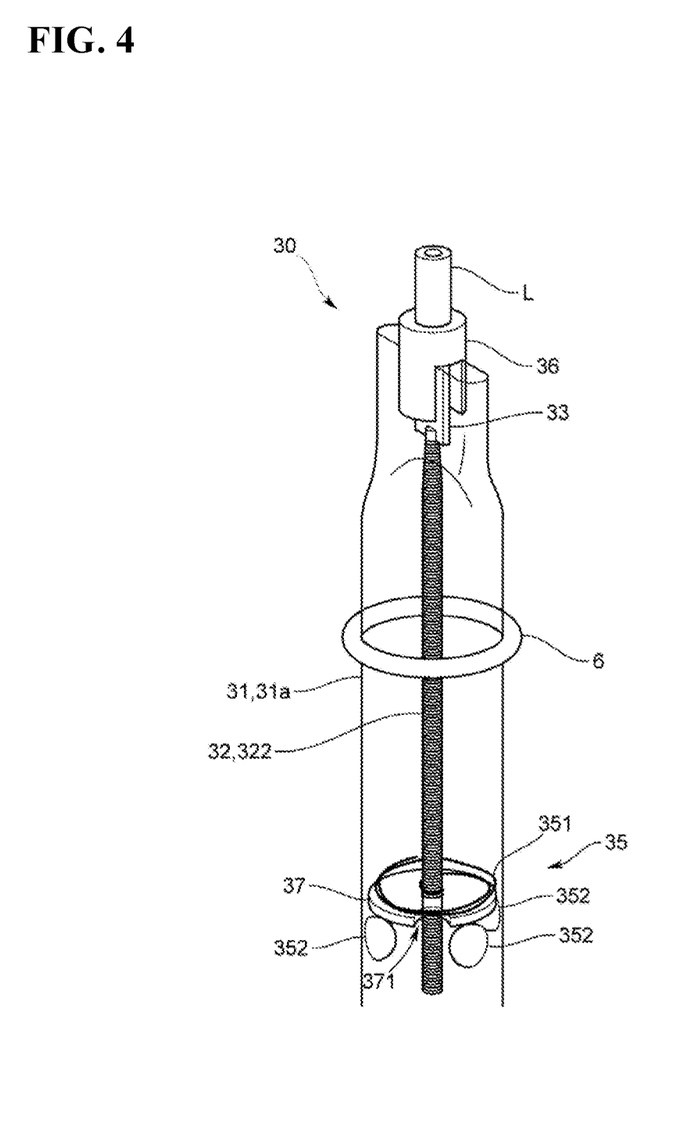
FIG. 4 is a schematic diagram showing a detailed configuration of a light leakage suppression member of the heater of FIG. 3, according to an embodiment.

Therefore, as shown in FIGS. 3 and 4, the heater 30 may further include a light leakage suppressing member 37 provided inside the tube-shaped body 31 to at least partly block light rays which would otherwise leak from inside the vacuum chamber S2 toward the terminal part 33, among light rays emitted from the heating wire 32.

FIG. 4 is a schematic diagram showing a detailed configuration of a light leakage suppression member of the heater of FIG. 3, according to an embodiment.

The light leakage suppressing member 37 may be, for example, a metal plate-shaped member having a light blocking property. In the embodiment illustrated in FIG. 4, the light leakage suppressing member 37 is provided such that the light leakage suppressing member 37 partitions an internal space of the tube-shaped body 31, and is formed with a vent portion 371 that communicates between the partitioned spaces.

The light leakage suppressing member 37 is supported by the protrusions 352 formed on the inner peripheral surface of each of the first end portion 31a and the second end portion 31b of the tube-shaped body 31. The position of the light leakage suppressing member 37 inside the tube-shaped body 31 may set to be approximately equal to the height position of the inner wall surface 42 of the upper wall 40 of the vacuum chamber S2, as best illustrated in FIG. 3. However, this is only an example and it should be noted that the position of the light leakage suppressing member 37 inside the tube-shaped body 31 is not limited thereto, and in some embodiments, the position may be set in a range from the height position of the inner wall surface 42 to a height position at which the ring-shaped sealing member 6 is provided. By providing the light leakage suppressing member 37 configured as above, it is possible to reduce not only light directed from the heating wire 32 toward the terminal part 33 but also light directed from the heating wire 32 toward the ring-shaped sealing member 6, thereby preventing degradation of the ring-shaped sealing member 6.

[Cooling Mechanism]

As shown in FIG. 3, the substrate heating device 200 may include a cooling mechanism 7 that cools the ring-shaped sealing member 6. For example, the cooling mechanism may be a cooling plate 7 attached to the upper wall 40.

The cooling plate 7 may include an internal flow passage 7L formed in the upper wall 40 of the vacuum chamber S2 to allow a cooling medium to flow therethrough. The internal flow passage 7L may be configured to communicate between an inlet port 7a provided in the cooling plate 7 to allow the cooling medium to be introduced therethrough, and an outlet port 7b provided in the cooling plate 7 to allow the cooling medium to be discharged therethrough (see FIG. 2), and to allow the cooling medium to flow from the inlet port 7a to the outlet port 7b in a meandering pattern. The cooling medium may be cooling water. However, this is only an example and, in some embodiments, it is possible to use, as the cooling medium, any of various fluids or a gas.

Further, a position in the upper wall 40 in which the cooling medium flow passage 7L is provided is not limited to the position illustrated in FIG. 3. For example, the cooling medium flow passage 7L may be provided in the mounting member 50 or a portion of the upper wall 40 adjacent to the through-hole 40h. Further, in a case in which gas is used as the cooling medium, gas may be inserted (e.g., flowed) from above the mounting member 50 toward the ring-shaped sealing member 6.

<<Functions/Effects>>

In the substrate heating device 200 configured according to the various embodiments described above, the terminal part 33 of the heater 30 is disposed outside the vacuum chamber S2, so that light directed toward the terminal part 33 from the heating wire 32 can be blocked by the inner wall surface 42 of the upper wall 40 of the vacuum chamber S2, and thereby it is possible to insert the heater 30 inside the vacuum chamber S2, while suppressing the situation where the terminal part 33 is heated by irradiation with light from the heating wire 32.

This makes it possible to increase an allowable level of wattage of the terminal part 33, as compared with the related art in which the terminal part 33 is disposed inside the vacuum chamber S2. By increasing the allowable level of wattage of the terminal part 33, heating efficiency can be improved by raising the temperature of the heating wire 32 accordingly, or a lifetime of the heater 30 can be improved by maintaining electric power to be supplied to the heating wire 32, at the same level.

Further, in addition to the terminal part 33, the lead wire L is also disposed outside the vacuum chamber S2, so that it is possible to prevent a situation where impurities originated from the lead wire L arise inside the vacuum chamber S2.

If the terminal part 33 is disposed inside the vacuum chamber S2 as in the related art, halogen gas encapsulated in the tube-shaped body 31 is likely to leak from the vicinity of the insulators attached to the terminal part 33, leading to the occurrence of electrical discharge around the terminal part 33. In the heater 30 according to various embodiments described above, the terminal part 33 is disposed outside the vacuum chamber S2, so that there is no risk of the occurrence of electrical discharge caused by the gas leakage.

In the substrate heating device 200, the amount of heat generation of the penetration portion 32 of the heating wire 32 may be set to be relatively low, so that it is possible to reduce a thermal influence on the ring-shaped sealing member 6, and reduce degradation of the ring-shaped sealing member 6.

In the substrate heating device 200, the light leakage suppressing member 37 may be provided to suppress a situation where light emitted from the heat generation portion 321 and the penetration portion 322 leads toward the terminal part 33, so that it is possible to much more block light directed toward the terminal part 33 from the heating wire 32, thereby more effectively suppressing the situation where the terminal part 33 is heated by irradiation with light from the heating wire 32.

<<Modifications>>

It should be understood that the present disclosure is not limited to the above embodiments.

For example, embodiments described above are based on an example in which the heater 30 is provided in a lock chamber. Alternatively, the heater 30 may be provided in the processing chamber S1 to heat the substrate W or may be provided in the transfer chamber S3 to heat the substrate W. In this configuration, the processing chamber S1 or the transfer chamber S3 may serve as the vacuum chamber. In this regard, when heating the substrate W held by the platen in the lying-down posture P, the heater 30 may be advantageously mounted to an upper wall 40 of the processing chamber S1. On the other hand, when heating the substrate W held by the platen 10 in the upstanding posture Q, the heater 30 may be advantageously mounted to a side wall of the processing chamber S1.

Further, in the embodiments described above, a halogen lamp heater is used as the heater 30. Alternatively, according to other embodiments, any other type of heater such as a carbon heater may be used. Specific examples of the carbon heater may include a carbon heater in which inert gas such as nitrogen gas or argon gas is encapsulated in the tube-shaped body 31, and a carbon filament is used as the heating wire 32.

In the embodiments described above, the heating wire 32 is configured such that the wire diameter of the penetration portion 322 is greater than that of the heat generation portion 321. However, a method to allow the electrical resistance of the penetration portion 322 to become less than that of the heat generation portion 321 is not limited thereto. For example, the heat generation portion 321 and the penetration portion 322 may be formed using different materials.

Figure 5:
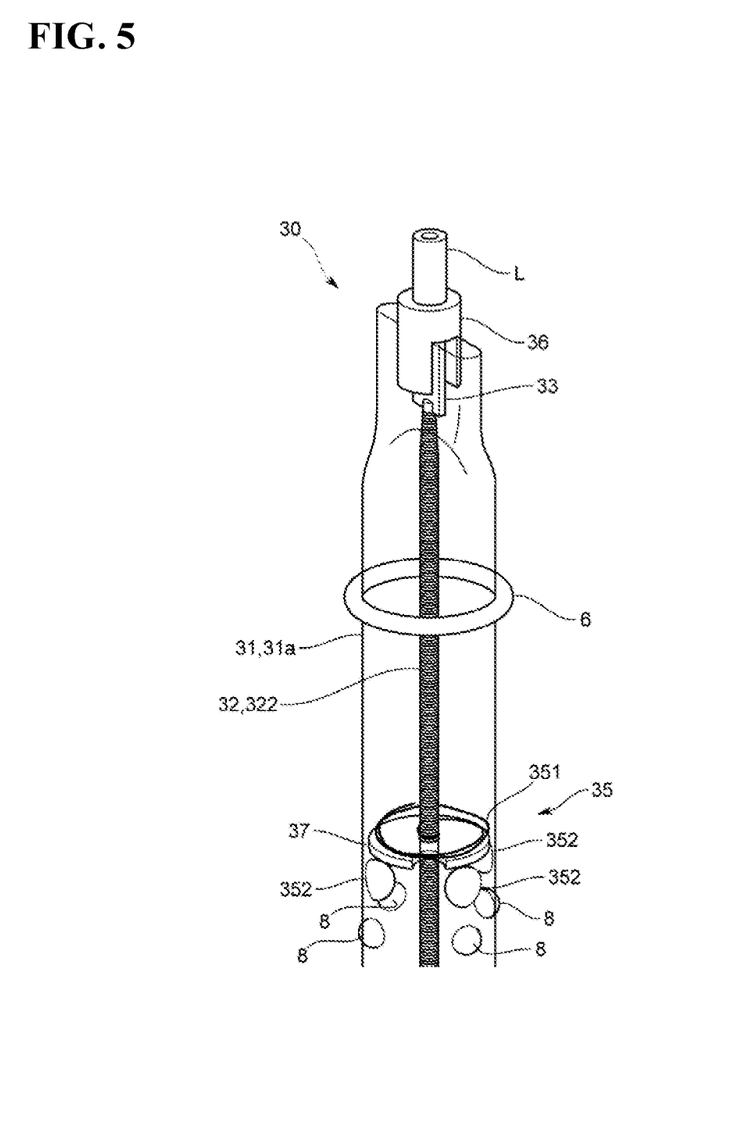
FIG. 5 is a schematic diagram showing an example of a modification of a heater, according to an embodiment.

Further, the substrate heating device may be configured such that the tube-shaped body 31 is positioned in the inside of the vacuum chamber S2, according to the position of the ring-shaped sealing member 6 provided on the outer peripheral surface of the tube-shaped body 31. Alternatively, as shown in FIG. 5, a locking portion 8 may be provided on the outer peripheral surface of the tube-shaped body 31 to protrude outwardly, wherein the tube-shaped body 31 may be positioned by engaging the locking portion 8 with, e.g., an outer wall surface of the mounting member 50 or the wall. In some embodiments, the locking portion 8 may include a plurality of protrusions.

Further, a reflective plate may be provided on the inner wall surface 42 of the wall to which the heater 30 is mounted, so as to reflect heat from the heater 30 toward the substrate W. This makes it possible to more effectively heat the substrate W.

Figures 6A, 6B:
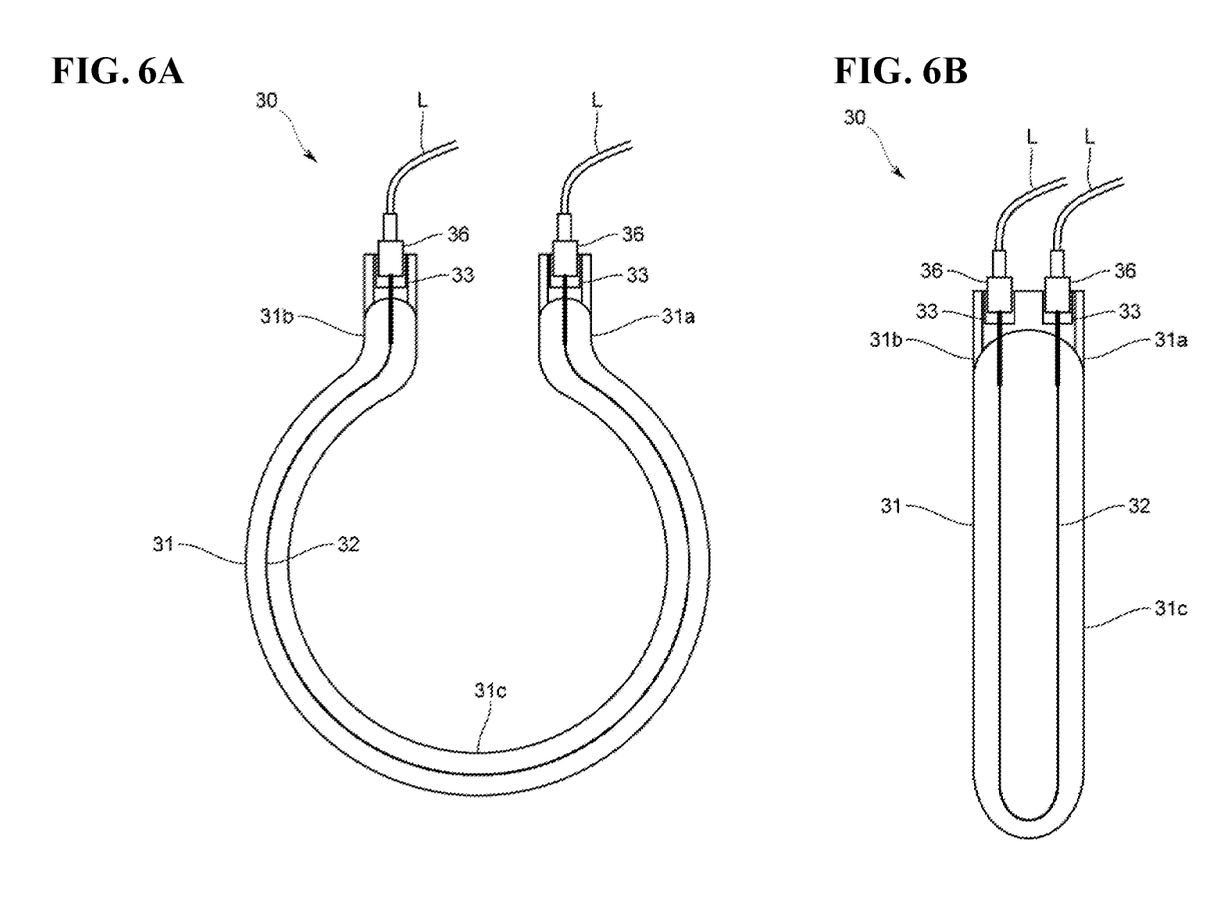
FIGS. 6A and 6B are schematic diagrams showing an example of another modification of a heater, according to various embodiments.

The tube-shaped body 31 may have the elongated portion 31c bent from the first end portion 31a and the second end portion 31b and formed in a straight tube shape. Alternatively, in some embodiments, the elongated portion 31c may be formed in a circular shape extending from the first end portion 31a to the second end portion 31b, as shown in FIG. 6A. The circular shape here includes an oval (elliptical) shape and a partial arc shape.

Further, as shown in FIG. 6B, in a case where the first end portion and the second end portion are arranged on a same side of the upper wall 40 (i.e., are arranged so as to be relatively close together at the position at which the first and second end portions 31a, 31b penetrate the upper wall 40), the elongated portion 31c may be formed in a straight shape extending from the first end portion and the second end portion without being bent (i.e., only being bent at a lowermost portion as illustrated in FIG. 6B).

The substrate heating device may be configured such that a part of the heating wire 32 obtained by winding a conductor wire to form a coiled wire is disposed inside the vacuum chamber S2. Alternatively, in some embodiments, a conductor wire (i.e., a coiled wire) may connect between the pair of terminal parts 33 (i.e., in a configuration in which the terminal parts 33 are positioned outward of an inner wall surface 42 rather than an outer surface 41 of the upper wall 40, and only a portion disposed inside the vacuum chamber S2 is formed as a coiled wire, and thus the resulting heating wire 32 may be entirely disposed inside the vacuum chamber S2. In other words, where only the terminal parts 33 are provided outside the inner wall surface 42, a larger portion of the resulting heating wire 32 may be disposed inside the vacuum chamber S2 than in a case in which the terminal parts 33 are provided outside the outer wall surface 41 of the upper wall 40.

In some embodiments, the substrate heating device 200 may further comprise a shutter mechanism configured to close up a gap between the outer peripheral surface of the tube-shaped body 31 and an inner peripheral surface defining the through-hole 3140h, in a state in which the tube-shaped body 31 penetrates through the through-hole 40h formed in the upper wall 40.

In some embodiments, the shutter mechanism may include a cutout formed circumferentially along the outer peripheral surface of the tube-shaped body 31; and shutter members capable of sandwiching the tube-shaped body 31 in a radial direction while being fitted in the cutout, wherein the shutter members are configured to be moved along the inner wall surface 42 of the upper wall 40, between a closed position where they close the gap and an open position where they open the gap. For example, the shutter members may include a pair of shutter members, one for each of the first and second end portions 31a, 31b of each individual heater 30.

In this configuration, light directed from the heating wire 32 to the terminal part 33 can be further blocked by moving the shutter members to the closed position.

In the shutter mechanism, the shutter members needs not be necessarily configured to be movable. For example, after sandwiching the tube-shaped body 31 in the radial direction by the pair of shutter members, the shutter members may be fixed to the inner wall surface 42 of the upper wall 40.

The substrate heating device 200 may constitute a part of the ion beam irradiation apparatus 100. Alternatively, in some embodiments, the substrate heating device 200 may be incorporated and used in any of various other apparatuses such as a vacuum deposition apparatus, having a need to heat a substrate in a vacuum chamber S2.

It should be understood that the present disclosure is not limited to the above described embodiments, but various changes and modifications may be made therein without departing from the spirit and scope thereof as set forth in appended claims.

What is claimed is:

1. A substrate heating device comprising:
    a vacuum chamber that receives a substrate; and
    a heater comprising:
        a body that penetrates through a wall of the vacuum chamber such that a portion of the body is in a vacuum atmosphere of the vacuum chamber, the body including a plurality of protrusions that protrude inwardly from an inner peripheral surface of a portion of the body that penetrates through the wall;
        a heating wire provided inside the body and partly disposed inside the vacuum chamber;
        a support member provided inside the body and attached to the heating wire, the support member being supported by each of the plurality of protrusions, wherein the support member and the plurality of protrusions are discrete;
        a terminal part to which the heating wire is connected, the terminal part being disposed outside the vacuum chamber; and
        a light leakage suppressing member that is provided inside the body and that blocks light rays emitted from the heating wire,
    wherein the body is disposed to penetrate through a through-hole formed in the wall, and provided with a sealing member around an outer peripheral surface thereof, and
    wherein the heating wire is configured such that an amount of heat generated by the heating wire at a first portion of the body penetrating through the through-hole is less than that at a second portion of the body disposed inside the vacuum chamber,
    wherein the heating wire is configured such that an electrical resistance of the first portion is less than that of the second portion, and
    wherein the light leakage suppressing member is supported by the plurality of protrusions.

2. The substrate heating device as recited in claim 1, wherein the light leakage suppressing member separates the support member and the plurality of protrusions.

3. The substrate heating device as recited in claim 1, wherein a position of the light leakage suppressing member inside the body lies in a range from a height position of an inner wall surface of the wall to a height position at which the sealing member is provided.

4. The substrate heating device as recited in claim 1, wherein the body comprises a first end portion and a second end portion each penetrating through the wall, and an elongated portion that connects the first end portion to the second end portion and is bent from the first end portion and the second end portion and disposed inside the vacuum chamber.

5. The substrate heating device as recited in claim 1, wherein the body is a tube-shaped body.

6. The substrate heating device as recited in claim 1, wherein the body is a tube-shaped body and the sealing member is a ring-shaped sealing member.

7. The substrate heating device as recited in claim 1, wherein the body forms the plurality of protrusions.

8. The substrate heating device as recited in claim 1, wherein the body penetrates through the wall of the vacuum chamber in a vertical direction, and the support member is supported in the vertical direction by each of the plurality of protrusions when the body is vertically oriented.

9. A substrate heating device comprising:

a vacuum chamber that receives a substrate; and a heater comprising:

a body that penetrates a wall of the vacuum chamber, a first portion of the body being disposed in the vacuum chamber, the body including a plurality of protrusions that protrude inwardly from an inner peripheral surface of a portion of the body that penetrates through the wall;

a heating wire provided inside the body;

a support member provided inside the body and attached to the heating wire, the support member being supported by each of the plurality of protrusions, wherein the support member and the plurality of protrusions are discrete;

a terminal part to which the heating wire is connected, the terminal part being disposed outside the vacuum chamber; and a light leakage suppressing member that is provided inside the body and that blocks light rays emitted from the heating wire, wherein the body is disposed to penetrate through a through-hole formed in the wall, and provided with a sealing member around an outer peripheral surface thereof, and wherein the heating wire is configured such that an amount of heat generated by the heating wire at a second portion of the body penetrating through the through-hole is less than that at the first portion of the body, wherein the heating wire is configured such that an electrical resistance of the second portion is less than that of the first portion, and wherein the light leakage suppressing member is supported by the plurality of protrusions.

10. The substrate heating device as recited in claim 9, wherein the body comprises a third portion disposed outside the wall.

11. The substrate heating device as recited in claim 10, wherein the terminal part is provided at a distal end of the third portion.

12. The substrate heating device as recited in claim 9, wherein the sealing member seals the second portion to maintain the second portion in a vacuum atmosphere of the vacuum chamber.

13. The substrate heating device as recited in claim 9, further comprising a metal plate that is provided inside the body and that blocks light rays emitted from the heating wire.

14. The substrate heating device as recited in claim 9, wherein the body forms the plurality of protrusions.

15. A substrate heating device comprising:

a vacuum chamber that receives a substrate; and a heating device including a plurality of heaters, each comprising:

a body that penetrates a wall of the vacuum chamber, a first portion of the body being disposed in the vacuum chamber, the body including a plurality of protrusions that protrude inwardly from an inner peripheral surface of a portion of the body that penetrates through the wall;

a heating wire provided inside the body;

a support member provided inside the body and attached to the heating wire, the support member being supported by each of the plurality of protrusions, wherein the support member and the plurality of protrusions are discrete;

a terminal part to which the heating wire is connected, the terminal part being disposed outside the vacuum chamber; and a light leakage suppressing member that is provided inside the body and that blocks light rays emitted from the heating wire, wherein, in each heater:

the body is disposed to penetrate through a through-hole formed in the wall, and provided with a sealing member around an outer peripheral surface thereof, the heating wire is configured such that an amount of heat generated by the heating wire at a second portion of the body penetrating through the through-hole is less than that at the first portion of the body, the heating wire is configured such that an electrical resistance of the second portion is less than that of the first portion, and the light leakage suppressing member is supported by the plurality of protrusions.

16. The substrate heating device as recited in claim 15, wherein the body forms the plurality of protrusions.

* * * * *